United States Patent [19]

Vyne

[11] Patent Number: 4,492,929
[45] Date of Patent: Jan. 8, 1985

[54] OPERATIONAL AMPLIFIER HAVING ENHANCED GAIN THROUGH CURRENT FEEDBACK

[75] Inventor: Robert L. Vyne, Tempe, Ariz.
[73] Assignee: Motorola, Inc., Schaumburg, Ill.
[21] Appl. No.: 494,193
[22] Filed: May 13, 1983
[51] Int. Cl.$^3$ .............................................. H03F 3/45
[52] U.S. Cl. ..................................... 330/253; 330/257; 330/288
[58] Field of Search ................. 330/53, 253, 257, 288, 330/307, 297

[56] References Cited

U.S. PATENT DOCUMENTS 4,336,503 6/1982 Whatley .............................. 330/253

Primary Examiner—James B. Mullins
Assistant Examiner—Steven J. Mottola
Attorney, Agent, or Firm—Vincent B. Ingrassia

[57] ABSTRACT

An integrated operational amplifier circuit includes an input stage comprising first and second junction field effect transistors coupled to a current mirror circuit and an output stage including first and second NPN transistor means for respectively supplying current to and receiving current from a load. In order to compensate for voltage translated back to the output of the input stage, a portion of the current received by the second transistor means is fed back to a metallic power supply conductor. The input field effect transistors are also coupled to a current mirror means including degeneration resistors which are likewise coupled to the power supply conductor means. In this manner, a small portion of the current fed back to the power supply conductor means creates a voltage differential between the first and second degeneration resistors thus compensating for the voltage fed back to the output of the input stage.

7 Claims, 1 Drawing Figure

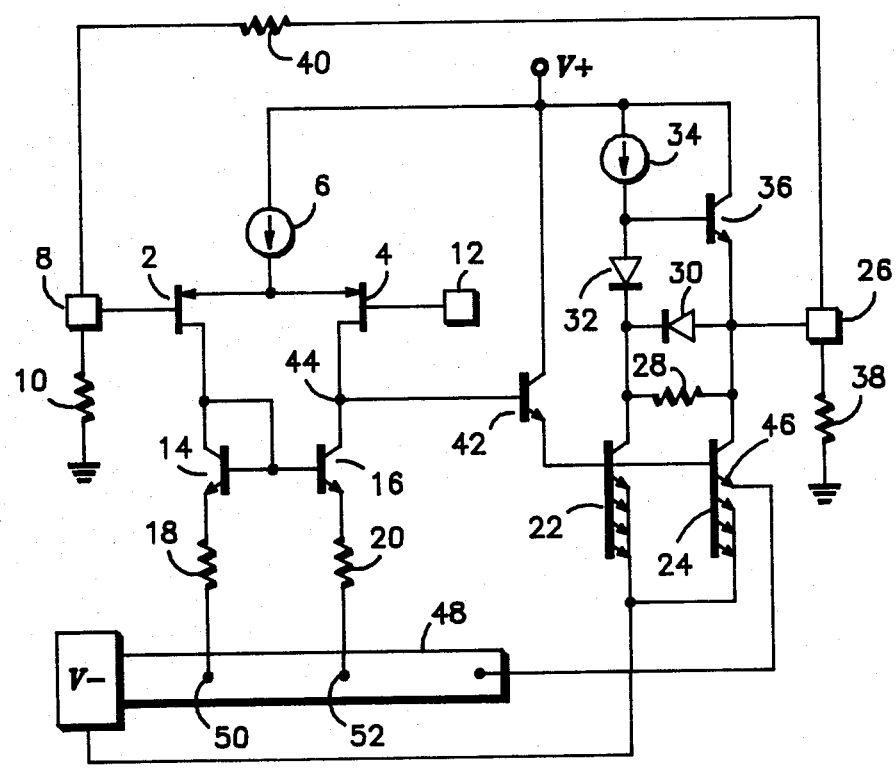

OPERATIONAL AMPLIFIER HAVING ENHANCED GAIN THROUGH CURRENT FEEDBACK

BACKGROUND OF THE INVENTION

This invention relates generally to operational amplifiers and, more particularly, to an operational amplifier utilizing input junction field effect transistors (JFETs) which directly drive a current mirror circuit, and an output stage comprised solely of NPN devices.

Operational amplifiers are known which utilize input junction field effect transistors (JFETs) which directly drive a current mirror circuit. Furthermore, in order to simplify integrated circuit construction, achieve a higher frequency response, greater output swing, and reduce output stage emitter follower peaking and excess phase with capacitive loads, it has been found desirable to provide an operational output stage which incorporates only NPN transistors. Such an output stage is shown and described in U.S. Pat. No. 3,416,092.

Unfortunately, in a P-channel JFET operational amplifier utilizing an NPN output stage being developed by the assignee of the present invention, it was discovered that the device exhibited poor DC gain while driving a load (e.g. a 2K ohm load from 0 volts to minus 10 volts). It was discovered that this gain problem was caused by a voltage $\Delta V_{BE}$ across the base-emitter terminals of the output power NPN devices (which were caused by load current changes) being reflected to the drains of the input JFETs (i.e. approximately 55 mv). Due to the low output impedance of the JFETs (e.g. only 600K ohms) the 55 mv change caused the gain of the circuit to be seriously degraded.

SUMMARY OF THE INVENTION

It is an object of the present invention to provide an improved operational amplifier.

It is a further object of the present invention to provide an operational amplifier having a JFET input stage and an all NPN output stage wherein current feedback is employed to compensate for reduction in gain caused by a $\Delta V_{BE}$ of the output power NPN device being reflected to the drain of an input junction field effect transistor.

According to a broad aspect of the invention there is provided an integrated operational amplifier circuit of the type which includes an output, and power supply conductor means for distributing power from a first source of supply voltage, said integrated operational amplifier circuit comprising: an input stage having an output node and including first and second field effect transistor input devices, said input stage being coupled across a portion of said power supply conductor means; and an output stage coupled to said output node and including first and second NPN transistor means each having base, emitter and collector terminals, said first NPN transistor means for conducting load current to said output and said second NPN transistor means for receiving load current from said output, said output stage being coupled to said power supply conductor means for supplying a portion of the current received by said second transistor means to said power supply conductor to generate a voltage in said input stage to compensate for voltage translated back to said output node from said output stage.

BRIEF DESCRIPTION OF THE DRAWING

The above and other objects, features and advantages of the present invention will be more clearly understood from the following detailed description taken in conjunction with the accompanying drawing which is a schematic diagram of the inventive operational amplifier.

DESCRIPTION OF THE PREFERRED EMBODIMENT

Referring to the drawing, the operational amplifier input stage comprises first and second P-channel junction field effect transistors 2 and 4 each having a source coupled to a positive source of supply voltage (V+) via current source 6. The gate of JFET 2 is coupled to an input pad 8 which has input resistor 10 associated therewith. The gate of JFET 4 is coupled to a second input pad 12. The drain electrodes of JFETs 2 and 4 are coupled to a current mirror circuit including NPN transistors 14 and 16. As can be seen, the drain of JFET 2 is coupled to the collector of transistor 14, and the drain of JFET 4 is coupled to the collector of transistor 16. The base electrodes of transistors 14 and 16 are coupled together and to the collector of transistor 14. The emitters of transistors 14 and 16 each have a degeneration resistor 18 and 20 respectively associated with their respective emitters.

The amplifier's output stage includes first and second multiemitter NPN current sink transistors 22 and 24, transistor 24 having a collector coupled to output pad 26, and transistor 22 having a collector coupled to output pad 26 via resistor 28. A first diode 30 has its anode coupled to the collector of transistor 24 and to output pad 26 and has a cathode coupled to the collector of transistor 22. A second diode 32 has an anode coupled to V+ via current source 34 and to the base of NPN pull-up transistor 36, and has a cathode coupled to the collector of transistor 22. NPN pull-up transistor 36 has a collector coupled to V+ and an emitter coupled to output pad 26. A load resistor 38 is associated with output pad 26, and output pad 26 is coupled to input pad 8 via a feedback resistor 40.

The input and output stages are coupled together by means of NPN transistor 42 which has a collector coupled to V+, a base coupled to node 44 (the junction of the drain of JFET 4 and the collector of transistor 16), and an emitter coupled to the base electrodes of pull-down transistors 22 and 24.

As is well known to the skilled practitioner, base drive is supplied to or diverted from the base of transistor 42 depending upon the relative value of the voltages at input pads 8 and 12. For example, if the voltage at pad 8 is low and that at pad 12 is high, JFET 2 will turn on. Due to the current mirror action of transistors 14 and 16, current will be diverted from the base of transistor 42 in an attempt to mirror the current flowing in the drain of JFET 2. Similarly, if the voltage at pad 12 is low while that at pad 8 is high, JFET 4 will turn on and JFET 2 will remain off. Thus, current being supplied through JFET 4 will be supplied to the base of transistor 42 turning it on.

When transistor 42 is turned on, pull-down transistors 22 and 24 are likewise turned on causing the voltage at output pad 26 to drop. With transistor 42 off, pull-down transistors 22 and 24 remain off. Transistor 36 is turned on causing current to be supplied to output pad 26 causing its voltage to rise.

Diode 30 is provided to protect transistor 36 in the event that output pad 26 should become shorted to the positive rail V+ when transistors 22 and 24 are on. Were it not for diode 30, a very high current will flow through resistor 28 causing a detrimental break down of the base emitter junction of transistor 36 through diode 32. With diode 30 connected as shown, a portion of the short circuit current is conducted through diode 30 and transistor 22 bypassing resistor 28.

As stated previously, the base-emitter voltage ($V_{BE}$) of the output pull-down transistors 22 and 24 increases when sinking load current thus producing a positive $\Delta V_{BE}$. This voltage translates to node 44 in the first stage. If the first stage were not a JFET input stage, the translation of $\Delta V_{BE}$ to node 44 would not present a major problem. However, since JFETs have a low output impedance, the introduction of $\Delta V_{BE}$ at node 44 results in significant current change in JFET 4 and therefore significant gain reduction.

To compensate for this problem, a portion of the pull-down current (that flowing through emitter 46) is applied to a first end of ground bus (e.g. aluminum) 48. The other end of ground bus 48 is coupled to a source of a second supply voltage (V−) as are the remaining emitters of pull-down transistors 22 and 24. As can be seen, resistors 18 and 20 are likewise coupled to ground bus 48 at 50 and 52 respectively. By feeding back a small portion of the sink current, a voltage is established between resistors 18 and 20 which reduces the current in transistor 16. This reduction in current also reduces the current in JFET 4 which increases the gain. It has been found that only 30 milli-ohms of metal between nodes 50 and 52 is necessary to bring about a significant increase in gain and that 50 milli-ohms will cause the gain to approach infinity at 25° C. It is important to note that the current feedback and therefore the increase gain has been accomplished without the incorporation of any additional elements. Only available metal is used to bring about the desired change.

The above description is given by way of example only. Changes in form and details may be made by one skilled in the art without departing from the scope of the invention. For example, diffused resistors could be used in place of ground bus 48. Further, the input devices need not be field-effect-transistors. PNP/NPN transistors may be utilized.

I claim:

1. An integrated operational amplifier circuit of the type which includes an output, and power supply conductor means for distributing power from a first source of supply voltage, said integrated operational amplifier circuit comprising:

an input stage having an output node and including first and second input transistor devices, said input stage being coupled across a portion of said power supply conductor means; and an output stage coupled to said output node and including first and second NPN transistor means each having base, emitter and collector terminals, said first NPN transistor means for conducting load current to said output and said second NPN transistor means for receiving load current from said output, said output stage being coupled to said power supply conductor means for supplying a portion of the current received by said second transistor means to said power supply conductor means to generate a voltage in said input stage to compensate for voltage translated back to said output node from said output stage.

2. A circuit according to claim 1 wherein said input stage comprises:

current mirror means coupled to said input transistors, said current mirror means including first and second transistors each having base, emitter and collector terminals, said first transistor having a collector coupled to said first input transistor and to its base, and a base coupled to the base of said second transistor, and said second transistor having a collector coupled to said second input transistor and to said output node; and first and second resistors coupled to the emitters of said first and second transistors respectively and to first and second points on said power supply conductor means respectively such that current flowing in said power supply conductor means from said second point to said first point will produce a voltage between said first and second points.

3. A circuit according to claim 2 wherein said second NPN transistor means comprises multi-emitter transistor means.

4. A circuit according to claim 3 wherein at least one emitter of said multi-emitter transistor means is coupled back to said power supply conductor means for supplying current thereto and wherein the remaining emitters of said multi-emitter transistor means are coupled to first source of supply voltage.

5. A circuit according to claim 4 wherein said multi-emitter transistor means comprises first and second multi-emitter transistors each having a base coupled to said output node and each having a collector coupled to said output.

6. A circuit according to claim 5 further comprising at least one follower transistor having a base coupled to said output node, a collector adapted to be coupled to a second source of supply voltage and an emitter coupled to the bases of said first and second multi-emitter transistors.

7. The circuit according to claim 6 wherein said first and second input transistors are junction field effect transistors.

* * * * *